(12) United States Patent  
Ren et al.

(10) Patent No.: US 9,093,589 B2
(45) Date of Patent: Jul. 28, 2015

(54) SOLID STATE LIGHTING DEVICES WITHOUT CONVERTER MATERIALS AND ASSOCIATED METHODS OF MANUFACTURING

(71) Applicant: Micron Technology, Inc., Boise, ID (US)

(72) Inventors: Zaiyuan Ren, Boise, ID (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/010,944

(22) Filed: Aug. 27, 2013

(65) Prior Publication Data

US 2013/0342133 A1    Dec. 26, 2013

Related U.S. Application Data

(62) Division of application No. 12/838,151, filed on Jul. 16, 2010, now Pat. No. 8,525,148.

(51) Int. Cl.
| | |
|---|---|
| *H01L 33/06* | (2010.01) |
| *H01L 33/08* | (2010.01) |
| *H01L 33/30* | (2010.01) |
| *C30B 25/00* | (2006.01) |
| *H01L 33/00* | (2010.01) |
| *H01L 21/02* | (2006.01) |

(52) U.S. Cl.
CPC .............. *H01L 33/06* (2013.01); *C30B 25/00* (2013.01); *H01L 33/007* (2013.01); *H01L 33/08* (2013.01); *H01L 21/0237* (2013.01); *H01L 21/0254* (2013.01); *H01L 21/0262* (2013.01); *H01L 21/02573* (2013.01)

(58) Field of Classification Search
CPC ...... H01L 33/06; H01L 33/30; H01L 33/0075
USPC ...................................... 438/35, 47
See application file for complete search history.

(56) References Cited

U.S. PATENT DOCUMENTS

| | | | |
|---|---|---|---|
| 5,684,309 A * | 11/1997 | McIntosh et al. ............ 257/191 |
| 6,240,114 B1 | 5/2001 | Anselm et al. |
| 6,933,160 B2 | 8/2005 | Hon |
| 7,323,721 B2 | 1/2008 | Liao et al. |
| 2001/0002048 A1 | 5/2001 | Koike et al. |
| 2003/0193979 A1 | 10/2003 | Lin |
| 2004/0066816 A1 | 4/2004 | Collins et al. |
| 2004/0227144 A1 | 11/2004 | Hon |
| 2005/0067627 A1 | 3/2005 | Shen et al. |
| 2006/0027820 A1 | 2/2006 | Cao |

(Continued)

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

*Primary Examiner* — George Fourson, III
(74) *Attorney, Agent, or Firm* — Perkins Coie LLP

(57) ABSTRACT

Solid state lighting devices that can produce white light without a phosphor are disclosed herein. In one embodiment, a solid state lighting device includes a first semiconductor material, a second semiconductor material spaced apart from the first semiconductor material, and an active region between the first and second semiconductor materials. The active region includes a first sub-region having a first center wavelength and a second sub-region having a second center wavelength different from the first center wavelength.

12 Claims, 6 Drawing Sheets

(56) References Cited

U.S. PATENT DOCUMENTS

| | | |
|---|---|---|
| 2008/0124827 A1 | 5/2008 | Huang et al. |
| 2009/0045394 A1 | 2/2009 | Smeeton et al. |
| 2009/0250686 A1 * | 10/2009 | Sato et al. .................. 257/13 |
| 2010/0065812 A1 * | 3/2010 | Nakahara et al. ............ 257/13 |
| 2010/0224860 A1 * | 9/2010 | Ibbetson et al. ............. 257/13 |
| 2011/0254471 A1 * | 10/2011 | Bahir et al. ................. 315/363 |
| 2012/0013273 A1 | 1/2012 | Ren et al. |

* cited by examiner

US 9,093,589 B2

SOLID STATE LIGHTING DEVICES WITHOUT CONVERTER MATERIALS AND ASSOCIATED METHODS OF MANUFACTURING

CROSS-REFERENCE TO RELATED APPLICATIONS

The present application is a divisional of U.S. application Ser. No. 12/838,151 filed Jul. 16, 2010, now U.S. Pat. No. 8,525,148, which is incorporated herein by reference.

TECHNICAL FIELD

The present disclosure is related to solid state lighting ("SSL") devices without converter materials and associated methods of manufacturing.

BACKGROUND

Mobile phones, personal digital assistants ("PDAs"), digital cameras, MP3 players, and other portable electronic devices utilize SSL devices (e.g., white light LEDs) for background illumination. SSL devices are also used for signage, indoor lighting, outdoor lighting, and other types of general illumination. However, true white light LEDs are not available because LEDs typically only emit at one center wavelength. For human eyes to perceive the color white, a mixture of wavelengths is needed.

One conventional technique for emulating white light with LEDs includes depositing a converter material (e.g., a phosphor) on an LED die. FIG. 1A shows a conventional SSL device 10 that includes a support 2 carrying an LED die 4 and a converter material 6. As shown in FIG. 1B, the LED die 4 can include a substrate 12, an N-type gallium nitride (GaN) material 14, GaN/indium gallium nitride (InGaN) multiple quantum wells ("MQWs") 16, a P-type GaN material 18, a first contact 20, and a second contact 22.

Referring to both FIGS. 1A and 1B, in operation, an electrical voltage is applied between the first and second contacts 20 and 22. In response to the applied voltage, the GaN/InGaN MQWs 16 of the LED die 4 produce a first emission (e.g., a blue light) that stimulates the converter material 6 to emit a second emission (e.g., a yellow light). The combination of the first and second emissions appears white to human eyes if matched appropriately. As discussed in more detail below, using converter materials to "convert" blue light into white light has certain drawbacks. Accordingly, several improvements in producing white light SSL devices without converter materials may be desirable.

DETAILED DESCRIPTION

Various embodiments of SSL devices configured to produce white light without a converter material and associated methods of manufacturing such SSL devices are described below. As used hereinafter, the term "SSL device" generally refers to LEDs, organic light emitting diodes ("OLEDs"), laser diodes ("LDs"), polymer light emitting diodes ("PLEDs"), and/or other suitable sources of illumination other than electrical filaments, a plasma, or a gas. The term "optical efficiency" is defined as a percentage of photon output per unit electron input. A person skilled in the relevant art will also understand that the technology may have additional embodiments, and that the technology may be practiced without several of the details of the embodiments described below with reference to FIGS. 2A-4B.

Figure 2A:
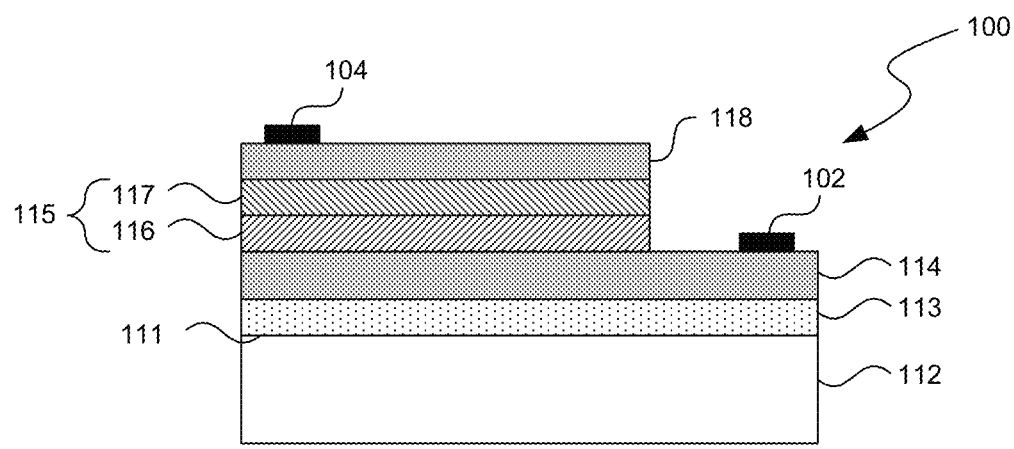
FIG. 2A is a schematic cross-sectional diagram of an SSL device configured to produce white light without a converter material in accordance with embodiments of the technology.

FIG. 2A is a schematic cross-sectional diagram of a SSL device 100 configured to produce white light without a converter material in accordance with embodiments of the technology. As shown in FIG. 2A, the SSL device 100 can include a substrate material 112, an optional buffer material 113, a first semiconductor material 114, an active region 115, and a second semiconductor material 118 arranged in series. In the illustrated embodiment, the SSL device 100 also includes a first contact 102 and a second contact 104 (e.g., gold/nickel contacts) on the first and second semiconductor materials 114 and 118, respectively. In other embodiments, the SSL device 100 can also include other suitable contact configurations. In further embodiments, the SSL device 100 can optionally include a reflective material (e.g., a silver film), a carrier material (e.g., a ceramic substrate), an optical component (e.g., a collimator), and/or other suitable components.

In certain embodiments, the substrate material 112 can include silicon (Si), at least a portion of which has the Si(1, 1,1) crystal orientation. In other embodiments, the substrate material 112 can include silicon with other crystal orientations (e.g., Si(1,0,0)), AlGaN, GaN, silicon carbide (SiC), sapphire ($Al_2O_3$), zinc oxide ($ZnO_2$), a combination of the foregoing materials and/or other suitable substrate materials. In the illustrated embodiment, the substrate material 112 has a generally planar surface 111 proximate to the optional buffer material 113. In other embodiments, the substrate material 112 may also include a non-planar surface (e.g., having openings, channels, and/or other surface features, not shown).

As shown in FIG. 2A, the SSL device 100 includes the optional buffer material 113 that is configured to facilitate formation of the first and second semiconductor materials 114 and 118 and the active region 115 on the substrate material 112. The optional buffer material 113 can include at least one of aluminum nitride (AlN), aluminum-gallium nitride (AlGaN), zinc nitride (ZnN), GaN, and/or other suitable materials formed via metal-organic chemical vapor deposition ("MOCVD"), molecular beam epitaxy ("MBE"), liquid phase epitaxy ("LPE"), hydride vapor phase epitaxy ("HVPE"), and/or other suitable techniques. In other embodiments, the optional buffer material 113 may be omitted.

The first and second semiconductor materials 114 and 118 can be configured as cladding structures for the active region 115. In certain embodiments, the first semiconductor material 114 can include an N-type GaN material (e.g., doped with silicon (Si)), and the second semiconductor material 118 can include a P-type GaN material (e.g., doped with magnesium (Mg)). In other embodiments, the first semiconductor material 114 can include a P-type GaN material, and the second semiconductor material 118 can include an N-type GaN material. In further embodiments, the first and second semiconductor materials 114 and 118 can include AlGaN, aluminum gallium arsenic (AlGaAs), and/or other suitable semiconductor materials.

The active region 115 can include at least two sub-regions that are configured to produce a plurality of emissions with different characteristics (e.g., center wavelengths) such that a combination of the emissions would at least approximate white light (or other suitable color) to human eyes. In certain embodiments, the different center wavelengths of the sub-regions of the active region 115 may be selected based on empirical data. For example, calibration tests may be carried out to test the chromatographic properties of the combined emissions. In other embodiments, the different wavelengths may be calculated based on band gap energies of the sub-regions of the active region 115. In further embodiments, the different center wavelengths may be selected based on a combination of the foregoing techniques and/or other suitable techniques.

In the embodiment shown in FIG. 2A, the active region 115 includes a first sub-region 116 and a second sub-region 117 stacked on the first sub-region 116. The first and second sub-regions 116 and 117 can individually include an InGaN single quantum well ("SQW"), GaN/InGaN MQWs, an InGaN bulk material, and/or other suitable structures and/or materials that produce emissions with different wavelength characteristics. As used hereinafter, a "bulk material" generally refers to a single grain material (e.g., InGaN) with a thickness greater than about 10 nanometers and up to about 500 nanometers. Certain examples of the first and second sub-regions 116 and 117 are described below with reference to FIGS. 2B-2D, though they may also include other suitable configurations. In other embodiments, the active region 115 can include three, four, or any other desired number of sub-regions in a stacked configuration. In further embodiments, the active region 115 can also include a plurality of sub-regions arranged laterally, as described in more detail below with reference to FIGS. 4A and 4B.

In operation, an electrical voltage is applied between the first and second contacts 102 and 104. An electrical current (not shown) can then flow between the first and second contacts 102 and 104 via the first semiconductor material 114, the first sub-region 116, the second sub-region 117, and the second semiconductor material 118. In response to the applied voltage and resulting current, the first and second sub-regions 116 and 117 produce a first emission (e.g., a blue light) and a second emission (e.g., a yellow light), respectively. The combined first and second emissions with certain desired characteristics (e.g., appearing white or other colors to human eyes) are then emitted to an external environment.

Figure 2B:
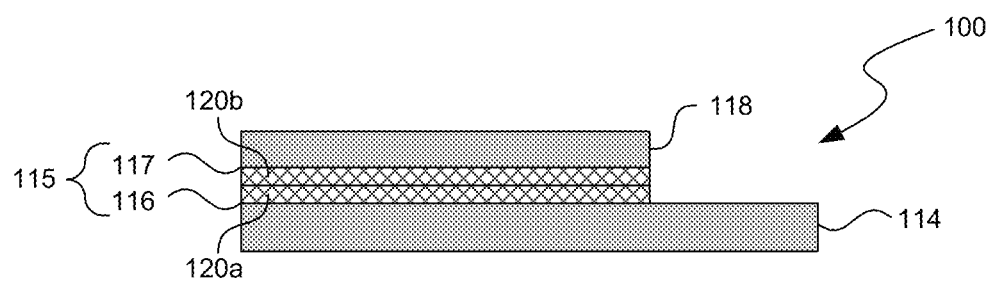
FIG. 2B is a schematic cross-sectional diagram of a portion of the SSL device in FIG. 2A having single quantum wells in accordance with embodiments of the technology.

FIG. 2B is a schematic cross-sectional diagram of a portion of the SSL device 100 in FIG. 2A having SQWs in accordance with embodiments of the technology. As shown in FIG. 2B, the first and second sub-regions 116 and 117 include a first SQW 120a adjacent to a second SQW 120b, respectively. In one embodiment, the first and second SQWs 120a and 120b can individually include an InGaN material having a thickness between about 1 nanometer and about 3 nanometers and an indium concentration of about 10% to about 25%. In other embodiments, the first and second SQWs 120a and 120b can also include other suitable types of semiconductor materials and/or thicknesses.

The first and second SQWs 120a and 120b can have different combinations of indium concentrations, thicknesses, and/or other suitable characteristics. In one example, the first SQW 120a can be about 15% indium and have a thickness of about 1 nanometer. The second SQW 120b can be about 25% indium and have a thickness of about 1.5 nanometers. In another embodiment, the first SQW 120a can be about 25% of indium and have a thickness of about 1.5 nanometers. The second SQW 120b can be about 10% indium and have a thickness of about 2.5 nanometer. In other examples, the first and second SQWs 120a and 120b can have other suitable combinations of indium concentrations and thicknesses. In further embodiments, the active region 115 can also include an intermediate material (e.g., GaN, not shown in FIG. 2B) and/or other suitable structures between the first and second SQWs 120a and 120b.

Figure 2C:
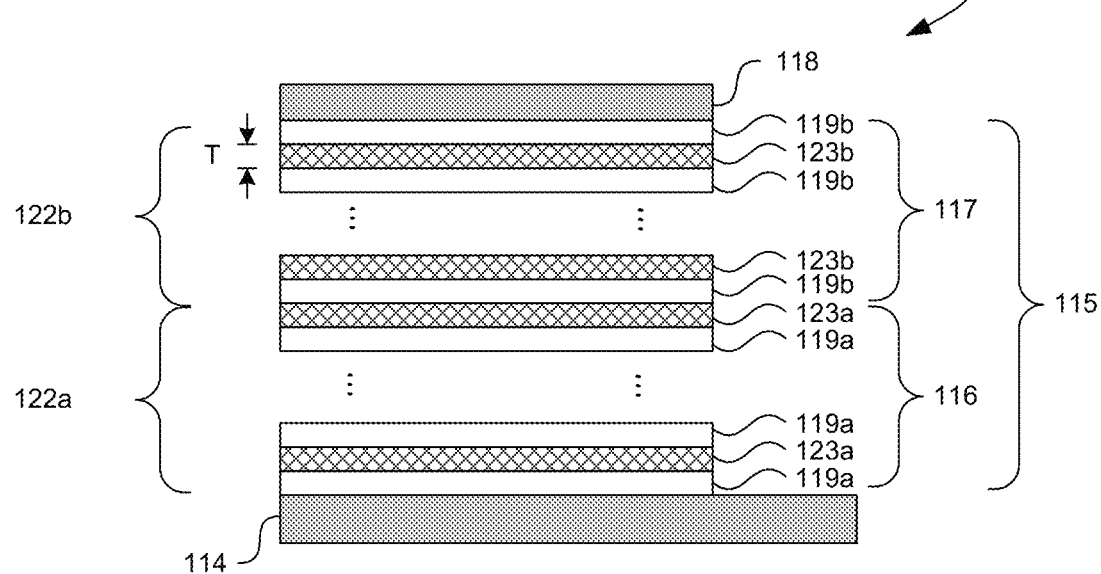
FIG. 2C is a schematic cross-sectional diagram of a portion of the SSL device in FIG. 2A having MQWs in accordance with embodiments of the technology.

FIG. 2C is a schematic cross-sectional diagram of a portion of the SSL device 100 in FIG. 2A having MQWs in accordance with embodiments of the technology. As shown in FIG. 2C, the first and second sub-regions 116 and 117 include first MQWs 122a adjacent to second MQWs 122b, respectively. In one embodiment, the first MQWs 122a include a plurality of first InGaN materials 123a separated from one another by a plurality of first passive materials 119a (e.g., GaN). The second MQWs 122b include a plurality of second InGaN materials 123b separated from one another by a plurality of second passive materials 119b (e.g., GaN). The individual first and second InGaN materials 123a and 123b can be generally similar to the first and second SQWs 120a and 120b (FIG. 2B) as discussed above with reference to FIG. 2B, or they can have other suitable configurations and/or structures. Even though SSL device 100 is shown in FIG. 2C as having only the first and second MQWs 122a and 122b, in other embodiments, the SSL device 100 can also include three, four, or any other suitable number of MQWs.

In one embodiment, the individual first InGaN materials 123a of the first MQWs 122a can have a first indium concentration and a first thickness. The individual second InGaN materials 123b of the second MQWs 122b can have a second indium concentration and a second thickness. At least one of the first concentration and the first thickness is different from the corresponding second concentration and second thickness. In other embodiments, at least one of the first and second InGaN materials 123a and 123b can have varying indium concentrations and/or thicknesses. For example, the first InGaN materials 123a of the first MQWs 122a can have indium concentrations that increase or decrease linearly, parabolically, exponentially, and/or otherwise sequentially. In another example, both the first and second InGaN materials 123a and 123b can have indium concentrations, thicknesses, and/or other characteristics that increase or decrease continuously such that the active region 115 has a continuous or otherwise varying profile of such characteristics.

Figure 2D:
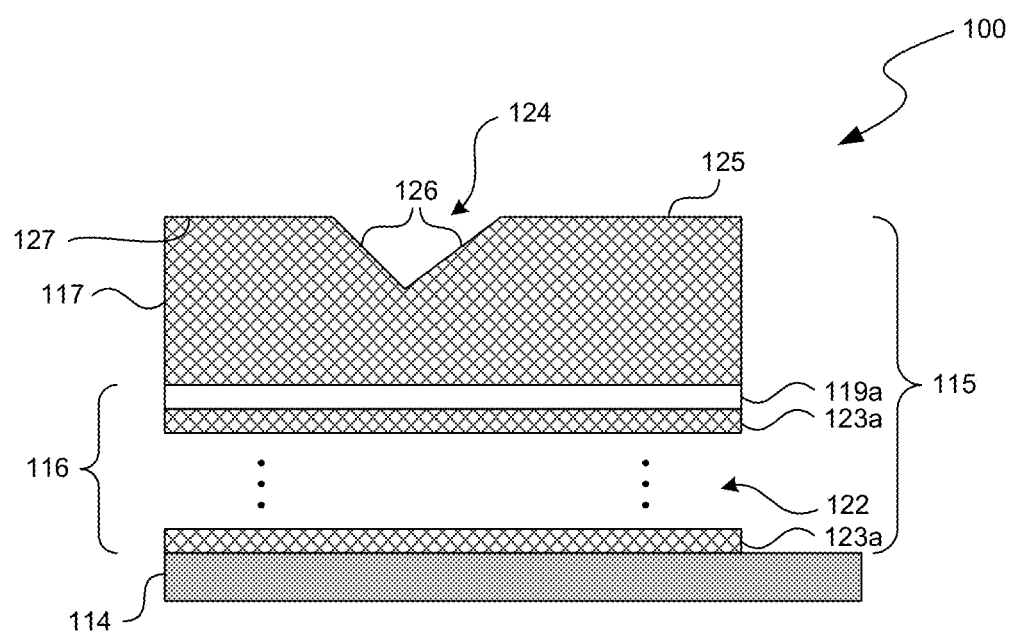
FIG. 2D is a schematic cross-sectional diagram of a portion of the SSL device in FIG. 2A having an InGaN bulk material in accordance with embodiments of the technology.

FIG. 2D is a schematic cross-sectional diagram of a portion of the SSL device 100 in FIG. 2A having an InGaN bulk material in accordance with embodiments of the technology. In the embodiment shown in FIG. 2D, the first sub-region 116 includes MQWs that can be generally similar to those described above with reference to FIG. 2C. The second sub-region 117 includes an InGaN bulk material 125 on top of the first sub-region 116. The InGaN bulk material 125 can have different indium concentrations and/or other characteristics than the first sub-region 116. In other embodiment, the first sub-region 116 may be formed on top of the second sub-region 117. In further embodiments, the first sub-region 116 can include an SQW and/or other suitable structures.

The inventors have observed that the InGaN bulk material 125 prepared via MOCVD typically has a top surface 127 with a plurality of pits 124 (only one is illustrated in FIG. 2D for clarity). As shown in FIG. 2D, the pit 124 includes sidewalls 126 extending into the InGaN bulk material 125 from the top surface 127. The sidewalls 126 were observed to form an inverted hexagonal pyramid shape. In certain embodiments, the top surface 127 can be along the c-plane of the InGaN bulk material 125, and the sidewalls 126 can be canted with respect to the top surface 127 and have a Miller Index of (10 $\bar{1}$ 1). In other embodiments, the top surface 127 and the sidewalls 126 can have other suitable crystal orientations.

The inventors have also observed that the InGaN bulk material 125 can have lower indium concentrations in or at least proximate to the pit 124 than other portions of the InGaN bulk material 125. Without being bound by theory, it is believed that the incorporation of indium in the pit 124 results in higher surface energy when compared to the incorporation of indium in other portions of the InGaN bulk material 125 during epitaxial growth via MOCVD. As a result, different indium concentrations can be achieved in the InGaN bulk material 125 so that the sub-region 117 can emit at multiple center wavelengths, which may better emulate white light.

Even though only certain examples of the first and second sub-regions 116 and 117 are described above with reference to FIGS. 2B-2D, in other examples, the first and second sub-regions 116 and 117 can have other suitable configurations. For example, the first sub-region 116 may include MQWs (as shown in FIG. 2C) while the second sub-region 117 includes an SQW (as shown in FIG. 2B). In another example, the first sub-region 116 can include an SQW (as shown in FIG. 2B) while the second sub-region 117 includes the InGaN bulk material 125 (as shown in FIG. 2D). In further examples, both the first and second sub-regions 116 and 117 can include InGaN bulk materials.

Various material and/or structural properties of the first and second sub-regions 116 and 117 can be adjusted to achieve the desired first and second center wavelengths in the SSL device 100 for emulating white light. For example, in the embodiment shown in FIG. 2B, the first and second center wavelengths in the SSL device 100 can be adjusted by varying (1) the thickness of and/or (2) the indium concentration in the first and/or second SQWs 120a and 120b. In another example, in the embodiment shown in FIG. 2C, the first and second center wavelengths in the SSL device 100 can be adjusted by varying at least one of (1) the thicknesses of individual SQWs; (2) the indium concentrations of the first and/or second MQWs 122a and 122b; and/or (3) the thicknesses of the passive materials 119. In a further example, in the embodiment shown in FIG. 2D, the first and second center wavelengths in the SSL device 100 can be adjusted by varying at least one of (1) the indium concentration in the InGaN bulk material 125, (2) a density and/or a size of the pits 124 in the InGaN bulk material 125, and (3) the indium concentration and/or thickness of the MQWs in 122. In yet further examples, the first and second center wavelengths in the SSL device 100 can be adjusted based on a combination of the foregoing properties of the first sub-region 116 and/or the second sub-region 117.

Figure 1A:
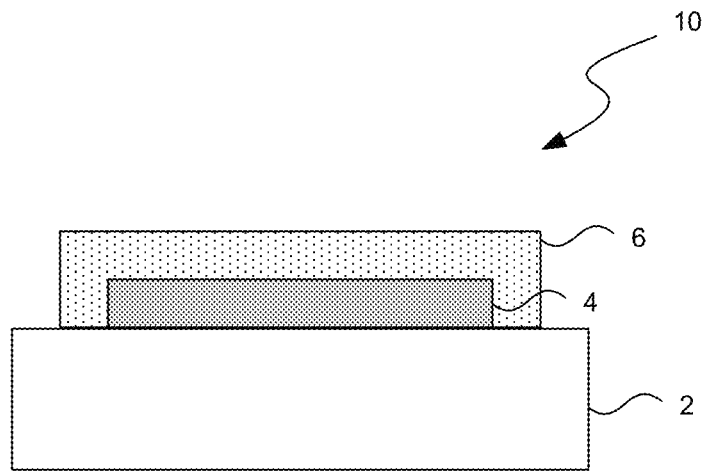
FIG. 1A is a schematic cross-sectional diagram of an SSL device in accordance with the prior art.
Figure 1B:
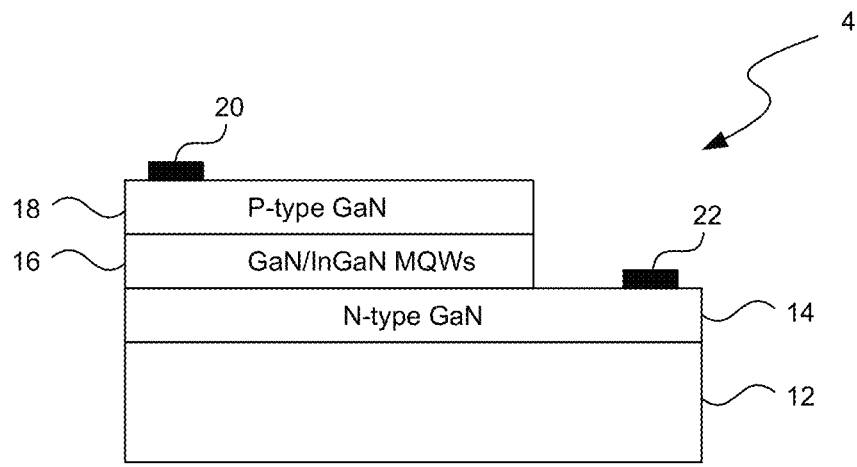
FIG. 1B is a schematic cross-sectional diagram of an LED die in accordance with the prior art.

Embodiments of the SSL device 100 shown in FIGS. 2A-2D can produce white light with increased optical efficiency when compared to conventional devices. For example, the optical efficiency of the SSL device 10 in FIG. 1A is rather low because the converter material 6 (FIG. 1A) absorbs a portion of the first emission from the LED die 4 to produce the second emission. The converter material 6, for example, typically converts only about 50% to 60% of the absorbed first emission to the second emission. As a result, about 40% to 50% of the absorbed first emission is converted to heat that must be dissipated. Accordingly, by eliminating converter materials, SSL devices can have higher optical efficiencies.

Embodiments of the SSL device 100 shown in FIGS. 2A-2D can also produce white light with increased reliability and longer useful life as compared to conventional devices. Typically, the converter material 6 includes a phosphor (e.g., Cerium(III)-doped Yttrium Aluminum garnet) carried in a matrix substrate (e.g., polystyrene). It has been observed that both the phosphor and the matrix substrate can degrade over time when exposed to high temperatures (e.g., junction temperatures of the LED die 4 in FIG. 1A) due at least in part to oxidation, de-polymerization, crystal lattice rearrangement, and/or other chemical/mechanical mechanisms. As a result, the SSL devices with converter materials tend to become less reliable over time. Accordingly, by eliminating converter materials, SSL devices can have increased reliability and longer useful life.

Further, embodiments of the SSL device 100 shown in FIGS. 2A-2D have lower manufacturing complexity and costs as compared to conventional devices. In conventional devices, both the amount and the composition of the converter material 6 must be precisely controlled to achieve a desired emission characteristic. For example, the converter material 6 can have different light emitting properties between a central region and a peripheral region of the LED die 4 because of temperature differences between these regions. Thus, deposition of the converter material 6 must be precisely controlled to achieve consistent light emitting properties. Such precise deposition control adds complexity and costs to the manufacturing process. In contrast, embodiments of the SSL device 100 shown in FIGS. 2A-2D can be readily formed via MOCVD, as described in more detail below with reference to FIGS. 3A and 3B.

Figure 3A:
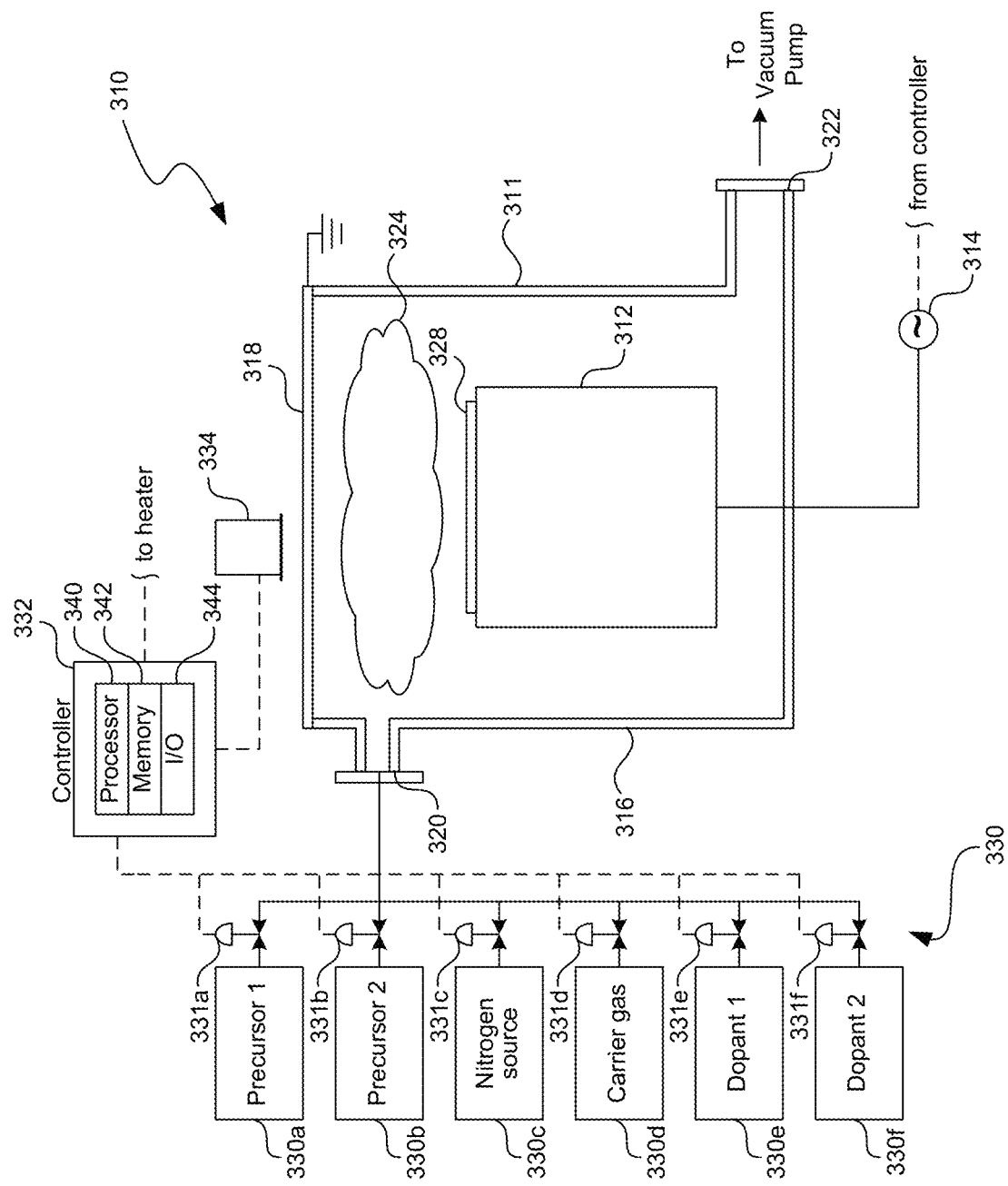
FIG. 3A is a schematic diagram illustrating a reactor useful for forming embodiments of SSL device in accordance with embodiments of the technology.

FIG. 3A is a schematic diagram illustrating a chemical vapor deposition ("CVD") reactor 310 useful for forming several embodiments of the SSL device 100. As shown in FIG. 3A, the reactor 310 includes a chamber 311, a support 312 inside the chamber 311, and a power source 314 electrically coupled to the support 312. The chamber 311 includes a vessel 316 coupled to an electrically grounded lid 318 to form a sealed environment inside the chamber 311. The chamber 311 also includes a gas inlet 320 proximate to an upper portion of the vessel 316 and a gas outlet 322 proximate to a bottom portion of the vessel 316. The reactor 310 can also include a vacuum pump (not shown) coupled to the gas outlet 322 for evacuating gases from the chamber 311.

The reactor 310 further includes a gas source 330 (identified individually as first to sixth gas sources 330a to 330O coupled to the gas inlet 320 via corresponding control valves 331 (identified individually as first to sixth valves 331a to 331O, a controller 332 operatively coupled to the valves 331, and a temperature sensor 334 (e.g., an infrared sensor) operatively coupled to the controller 332. The control valves 331 can individually include a needle valve, a globe valve, a ball valve, and/or other suitable types of valve coupled to a pneumatic actuator or other types of suitable actuator.

In the illustrated embodiment, the gas source 330 includes storage tanks that individually contain a first precursor (e.g., trimethylgallium, $Ga(CH_3)_3$, "TMG"), a second precursor (e.g., trimethylindium, $In(CH_3)_3$, "TMI"), a nitrogen-containing gas (e.g., ammonia, $NH_3$), a carrier gas (e.g., hydrogen, $H_2$), a first dopant (e.g., silane, $SiH_4$), and a second dopant (e.g., magnesium, Mg). In other embodiments, the gas source 330 can also include reaction chambers, vaporizers, and/or other suitable gas sources containing other precursors (e.g., trimethylaluminum, $Al(CH_3)_3$, "TMAl"), nitrogen-containing gases (e.g., trimethylamine, $N(CH_3)_3$, "TMA"), carrier gases (e.g., argon, Ar), dopants (e.g., boron, B), and/or other suitable compositions.

The controller 332 can include a processor 340 coupled to a memory 342 and input/output components 344. The processor 340 can include a microprocessor, a field-programmable gate array, and/or other suitable logic devices. The memory 342 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 340. The input/output components 344 can include a display, a touch screen, a keyboard, a mouse, and/or other suitable types of input/output devices configured to accept input from and provide output to an operator.

In certain embodiments, the controller 332 can include a personal computer operatively coupled to the other components of the reactor 310 via a communication link (e.g., a USB link, an Ethernet link, a Bluetooth link, etc.) In other embodiments, the controller 332 can include a network server operatively coupled to the other components of the reactor 310 via a network connection (e.g., an internet connection, an intranet connection, etc.) In further embodiments, the controller 332 can include a process logic controller, a distributed control system, and/or other suitable computing frameworks.

In operation, the gas source 330 can supply a mixture containing at least one of the precursors, the nitrogen-containing gas, and optionally a carrier gas to the chamber 311 via the gas inlet 320. The power source 314 creates a bias voltage between the support 312 and the lid 318 to establish and/or maintain a plasma 324 between the lid 318 and a silicon wafer 328 held on the support 312. The power source 314 can also supply power to the support 312 to heat the silicon wafer 328 to a desired temperature. The plasma 324 can then impart sufficient energy onto the precursors and/or the nitrogen-containing gas to form GaN, InGaN, and/or other suitable materials on the surface of the silicon wafer 328 via epitaxial growth. During operation, the controller 332 may be programmed to perform methods for forming various embodiments of the SSL device 100 shown in FIG. 2A-2D, as described in more detain with reference to FIG. 3B.

Figure 3B:
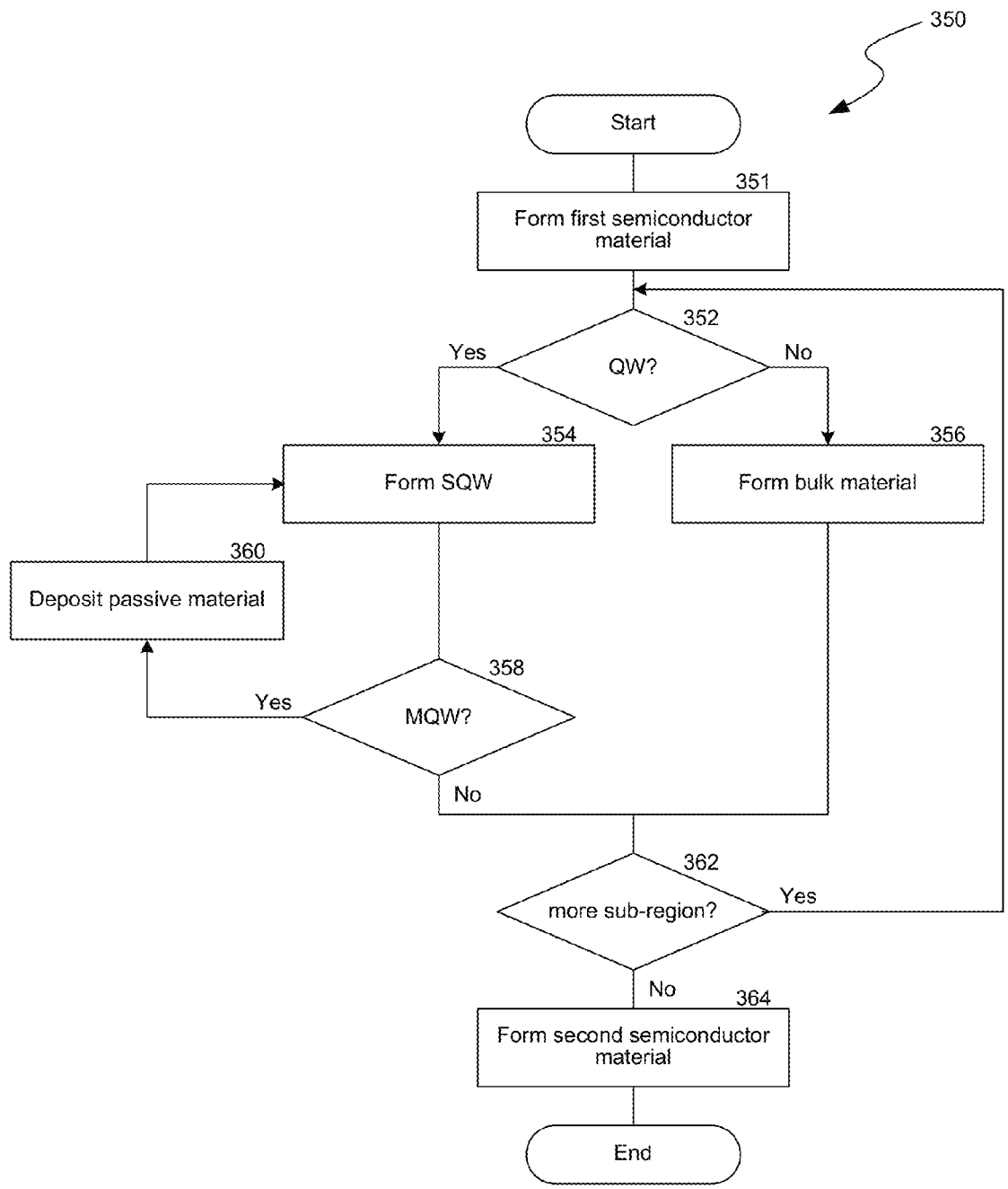
FIG. 3B is a flowchart illustrating a method for forming embodiments of the SSL device in FIGS. 2A-2D in accordance with embodiments of the technology.

FIG. 3B is a flowchart illustrating a method 350 for forming embodiments of the SSL device 100 in FIGS. 2A-2D in accordance with embodiments of the technology. Embodiments of the method 350 can be implemented as computer programs, procedures, or processes written as source code in C++ programming language or other suitable computer programming languages. Various implementations of the source code and/or object and byte codes of the computer programs, procedures, and processes may be stored as instructions in the memory 342 (FIG. 3A) of the controller 332 (FIG. 3A) and presented for execution by the CPU of the processor 340 (FIG. 3A). Even though various embodiments of the method for forming embodiments of the SSL device 100 are described below as via MOCVD in the reactor 310 of FIG. 3A, in other embodiments, at least some of the embodiments of the method 350 may also be applied to MOCVD in other suitable reactors and/or via MBE, LPE, HVPE, or other suitable techniques.

Referring to both FIGS. 3A and 3B, an initial stage 351 of the method 350 includes forming the first semiconductor material 114 (FIG. 2A) on the optional buffer material 113 or the substrate material 112. In one embodiment, the controller 332 can command the gas source 330 to supply the first precursor containing TMG, the nitrogen-containing ammonia, and the first dopant containing silicon to the reaction chamber 311 to form an N-type GaN material. In another embodiment, the controller 332 can command the gas source 330 to supply the first precursor containing TMG, the nitrogen-containing ammonia, and the second dopant containing magnesium to the reaction chamber 311 to form a P-type GaN material. In further embodiments, other types of precursors or dopants may be used to form generally similar or different semiconductor materials.

After the first semiconductor material 114 is formed with a desired thickness (e.g., between about 2 microns and about 4 microns), the method 350 can proceed to a first decision stage 352 to determine whether a first sub-region 116 of the active region 115 has a quantum well ("QW") or bulk material configuration. The decision may be based on operator input received by the processor 332 via the input/output components 344, a default selection, and/or other suitable criteria.

If the first sub-region has a bulk material configuration, the method 350 includes another stage 356 in which a bulk material is formed on the first semiconductor material 114. If the first sub-region has a QW configuration, the method 350 includes another stage 354 in which a SQW is formed. In one embodiment, forming the bulk material at stage 356 and forming the SQW at stage 354 can both include commanding the gas source 330 to supply a mixture of the first precursor containing TMG, the second precursor containing TMI, the nitrogen-containing ammonia, and optionally the carrier gas containing hydrogen into the reaction chamber 311. In other embodiments, other types of precursors, dopants, and/or other compositions may also be used.

During deposition in both stages 354 and 356, the controller 332 can adjust various operating parameters to at least influence the indium incorporation rate in the SQW or the bulk material. For example, the controller 332 can adjust the molar ratio of TMG to TMI, the molar ratio of ammonia to TMI, the concentration of TMI in the mixture, and/or other parameters to achieve a desired composition of TMI in the reaction chamber 311. The controller 322 can also adjust the power output to the support 312 to achieve a desired deposition temperature in the silicon wafer 328 by monitoring an input from the sensor 334. Without being bound by theory, it is believed that higher temperatures in the silicon wafer 328 may increase the evaporation of TMI from the surface of the silicon wafer 328, and thus may reduce the indium incorporate rate. The controller 332 can also adjust the partial pressure of TMI by varying the flow rate of at least one of ammonia, TMI, and optimally the carrier gas.

The controller 332 can also adjust various operating parameters to achieve the desired thickness of the formed InGaN material. In one embodiment, the controller 332 can monitor the elapsed time of deposition and stop the deposition when the desired deposition period is reached. In another embodiment, the reactor 310 can also include a scanning electron microscope, an ellipsometer, an interferometer, and/ or other suitable metrology tools (not shown) that can measure the thickness of the SQW in real time.

The controller 332 can then stop the deposition when the desired thickness is achieved for the SQW (e.g., about 1 to about 3 nanometers) or let the process continue until the desired thickness is achieved for the bulk material (e.g., about 300 nanometers to about 400 nanometers). In further embodiments, the controller 332 may also adjust other suitable operating parameters to achieve the desired thickness in the deposited InGaN material.

After the SQW is formed, the method 350 can proceed to a second decision stage 358 to determine whether the first sub-region includes MQWs and/or whether all layers of MQWs have been formed. If the first sub-region 116 includes MQWs or if more MQWs are to be formed, the method 350 includes another stage 360 in which a passive material 119 (FIG. 2C) is deposited on the SQW. In one embodiment, depositing the passive material 119 can include commanding the gas source 330 to supply the first precursor containing TMG, the nitrogen-containing ammonia, and optionally the carrier gas containing hydrogen to the reaction chamber 311 to form a GaN material on the SQW. In other embodiments, depositing the passive material 119 can also include forming an InGaN material, an AlGaN, and/or other suitable materials with suitable precursors. After the passive material 119 is formed, the process reverts to forming another SQW at stage 354, which may or may not have the same indium concentration, thickness, and/or other characteristics as the SQW already formed.

If the first sub-region does not include MQWs, if all layers of the MQWs have been formed, or if the first sub-region includes a bulk material, the method 350 proceeds to a third decision stage 362 to determine whether the active region 115 includes any additional sub-regions. If the active region 115 includes additional sub-regions (e.g., the second sub-region 117 in FIG. 2A), the process reverts to the first decision stage 352. As discussed above with reference to FIGS. 2A-2D, the second sub-region 117 may have a different structure, indium incorporation rate, thickness, and/or other characteristics from the first sub-region 116.

If the active region 115 does not include additional sub-regions, the method proceeds to another stage 364 in which the second semiconductor material 118 (FIG. 2A) is formed. In certain embodiments, forming the second semiconductor material 118 may be generally similar to forming the first semiconductor material 114. In other embodiments, forming the second semiconductor material 118 may include other suitable operations, processes, and/or routines.

Figure 4A:
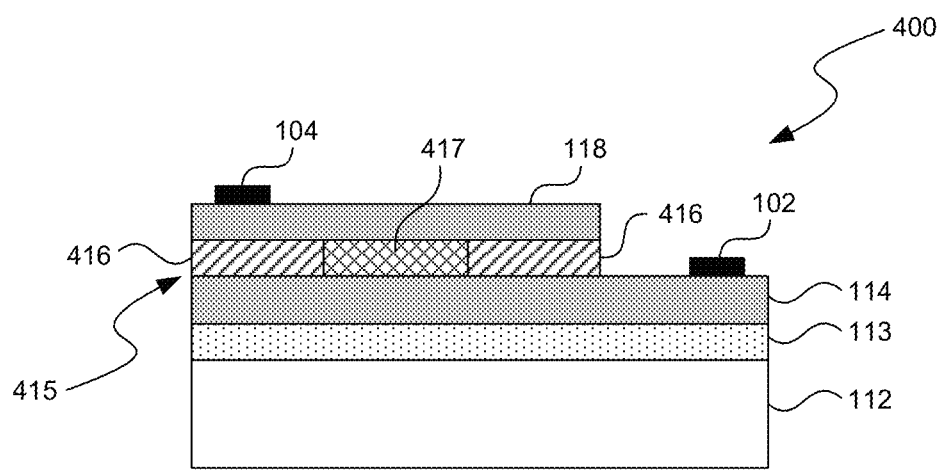
FIG. 4A is a schematic cross-sectional diagram of an SSL device configured to produce white light without a converter material in accordance with further embodiments of the technology.
Figure 4B:
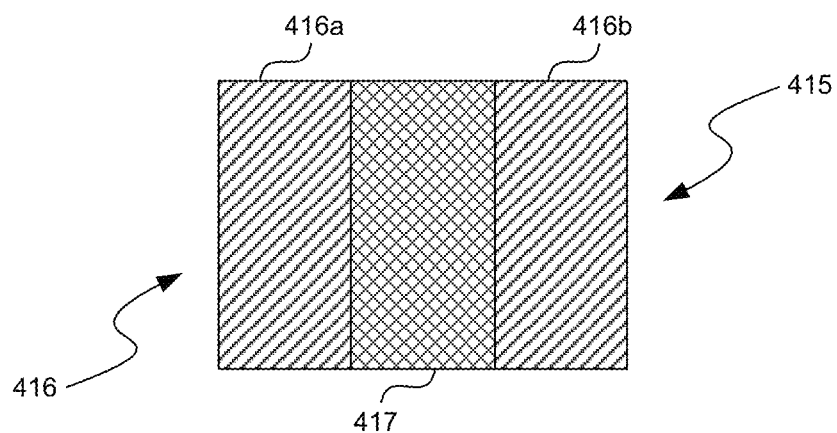
FIG. 4B is a schematic plan view diagram of an active region of the SSL device in FIG. 4A in accordance with embodiments of the technology.

Even though the active region 115 in FIGS. 2A-2D is described above as having a plurality of sub-regions stacked on top of one another, in other embodiments, the active region 115 can also include a plurality of sub-regions that are laterally arranged. FIG. 4A is a schematic cross-sectional diagram of an SSL device 400 configured to produce white light without a converter material in accordance with further embodiments of the technology. FIG. 4B is a schematic plan view diagram of an active region 415 of the SSL device 400 in FIG. 4A in accordance with embodiments of the technology. As shown in FIG. 4A, the active region 415 can include a first sub-region 416 and a second sub-region 417 that is laterally arranged with respect to the first sub-region 416. As shown in FIG. 4B, in one embodiment, the first sub-region 416 can include a first portion 416a spaced apart from a second portion 416b with the second sub-region 417 therebetween. In other embodiments, the first and/or second sub-regions 416 and 417 can have other lateral arrangements.

Embodiments of the SSL device 400 can be formed via MOCVD, MBE, LPE, HVPE, and/or other suitable techniques. For example, in one embodiment, the first sub-region 416 may be formed on the optional buffer material 113 via MOCVD in a reactor generally similar to that shown in FIG. 3A. Subsequently, the first sub-region 416 may be patterned via photolithograph and partially removed to form an opening (not shown). The second sub-region 417 may then be formed in the opening via MOCVD, MBE, LPE, HVPE, and/or other suitable techniques. In other embodiments, the optional buffer material 113 may be patterned with a first mask material (e.g., silicon nitride, not shown) before the first sub-region 116 is formed on the buffer material 113 in select areas. Subsequently, the first mask material may be removed, and a second mask material (e.g., silicon nitride, not shown) may be formed to shield the first sub-region 116. Subsequently, the second sub-region 117 may be formed while the first sub-region 416 is shielded by the second mask material.

From the foregoing, it will be appreciated that specific embodiments of the technology have been described herein for purposes of illustration, but that various modifications may be made without deviating from the disclosure. For example, SSL devices having GaN/InGaN materials are used as examples of SSL devices in accordance with embodiments of the technology described above. In other embodiments, several embodiments of the SSL device may also include an LED and/or an LD having at least one of gallium arsenide (GaAs), AlGaAs, gallium arsenide phosphide (GaAsP), aluminum gallium indium phosphide (AlGaInP), gallium(III) phosphide (GaP), zinc selenide (ZnSe), boron nitride (BN), AN, aluminum gallium nitride (AlGaN), aluminum gallium indium nitride (AlGaInN), and/or other suitable semiconductor materials. In addition, many of the elements of one embodiment may be combined with other embodiments in addition to or in lieu of the elements of the other embodiments. Accordingly, the disclosure is not limited except as by the appended claims.

We claim:

1. A method for producing a solid state lighting (SSL) device, comprising:
    forming a first semiconductor material on a substrate material;
    forming an active region on the first semiconductor material, the active region having a first sub-region having a first indium concentration and a second sub-region having a second indium concentration different from the first indium concentration, wherein the first and second indium concentrations are related to each other such that the active region produces an emission that approximates white light without using a phosphor, and wherein forming at least one of the first and second sub-regions includes forming an InGaN bulk material having a first indium concentration proximate a first areas and a second indium concentration proximate a second areas; and
    forming a second semiconductor material on the active region.

2. The method of claim 1 wherein forming the active region includes forming the first and second sub-regions such that the first sub-region includes InGaN materials having a first thickness, and the second sub-region includes InGaN materials having a second thickness different from the first thickness of.

3. The method of claim 1 wherein forming the active region includes:
    forming the first and second sub-regions of the active region via metal organic chemical vapor (MOCVD) deposition; and the method further includes adjusting at least one of a precursor concentration, a precursor molar ratio, a precursor partial pressure, a deposition temperature, and a deposition period based on at least one of the first indium concentration, the second indium concentration, and a thickness of InGaN materials included in the first sub-region, and a thickness of InGaN materials included in the second sub-region.

4. The method of claim 1 wherein:
forming the active region includes forming first and second sub-regions of the active region that individually include at least one of a bulk indium gallium nitride (InGaN) material, an InGaN SQW, GaN/InGaN MQWs via MOCVD; and
the method further includes adjusting at least one of an indium precursor concentration, an indium precursor to gallium precursor molar ratio, an indium precursor partial pressure, a deposition temperature, and a deposition period based on at least one of the first indium concentration, the second indium concentration, a thickness of InGaN materials included in the first sub-region, and a thickness of InGaN materials included in the second sub-region.

5. The method of claim 1 wherein the first areas of the InGaN bulk material include a generally planar surface and the second areas include a plurality of pits extending into the InGaN bulk material from the generally planar surface.

6. The method of claim 1 wherein:
the first areas of the first InGaN bulk material include a generally planar surface and the second areas include a plurality of pits extending into the InGaN bulk material from the generally planar surface such that the first InGaN bulk material is configured to emit light at multiple center wavelengths.

7. The method of claim 1 wherein:
the first areas of the first InGaN bulk material include a generally planar surface and the second areas include a plurality of pits extending into the InGaN bulk material from the generally planar surface;
the pits individually include a plurality of sidewalls extending from the generally planar surface into the InGaN bulk material; and
the second indium concentration is proximate the sidewalls of the pits.

8. The method of claim 1 wherein the other of the first or second sub-regions comprises a single quantum well (SQW) having an SQW active material.

9. The method of claim 1 wherein:
the first InGaN bulk material has a first bulk material thickness;
the other of the first or second sub-regions comprises an SQW including an SQW active material having an SQW active material thickness and an SQW active material indium concentration;
the SQW active material thickness is different than the first bulk material thickness; and
the SQW active material indium concentration is different than at least one of the first or second bulk material indium concentrations.

10. The method of claim 1 wherein the other of the first or second sub-regions comprises a multiple quantum well (MQW) having a plurality of MQW active materials.

11. The method of claim 1 wherein:
the first InGaN bulk material has a first bulk material thickness;
the other of the first or second sub-regions comprises an MQW including a plurality of MQW active materials individually having an MQW active material thickness and an MQW active material indium concentration;
the MQW active material thickness is different than the first bulk material thickness; and
the MQW active material indium concentration is different than at least one of the first or second bulk material indium concentrations.

12. The method of claim 1 wherein:
the first InGaN bulk material has a first bulk material thickness;
the other of the first or second sub-regions comprises a second InGaN bulk material having a second bulk material thickness different from the first bulk material thickness.

* * * * *

UNITED STATES PATENT AND TRADEMARK OFFICE
CERTIFICATE OF CORRECTION

PATENT NO. : 9,093,589 B2  Page 1 of 1
APPLICATION NO. : 14/010944
DATED : July 28, 2015
INVENTOR(S) : Zaiyuan Ren et al.

It is certified that error appears in the above-identified patent and that said Letters Patent is hereby corrected as shown below:

In The Claims

In column 10, line 61-62, in claim 2, delete "thickness of." and insert -- thickness. --, therefor.

Signed and Sealed this
Third Day of May, 2016

Michelle K. Lee
*Director of the United States Patent and Trademark Office*